(12) United States Patent
Zhu et al.

(10) Patent No.: US 9,964,589 B1
(45) Date of Patent: May 8, 2018

(54) SYSTEM FOR DETECTION OF A PHOTON EMISSION GENERATED BY A DEVICE AND METHODS FOR DETECTING THE SAME

(71) Applicant: Globalfoundries Singapore Pte. Ltd., Singapore (SG)

(72) Inventors: Lei Zhu, Singapore (SG); Pik Kee Tan, Singapore (SG); Zhihong Mai, Singapore (SG); Huei Hao Yap, Singapore (SG); Jeffrey Chor-Keung Lam, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days. days.

(21) Appl. No.: 15/346,025

(22) Filed: Nov. 8, 2016

(51) Int. Cl.
*G01R 31/02* (2006.01)
*G01R 31/311* (2006.01)
*G01R 31/307* (2006.01)
*G01R 31/28* (2006.01)

(52) U.S. Cl.
CPC ........ *G01R 31/311* (2013.01); *G01R 31/2894* (2013.01); *G01R 31/307* (2013.01)

(58) Field of Classification Search
CPC . G01R 31/311; G01R 31/307; G01R 31/2894
See application file for complete search history.

(56) References Cited

U.S. PATENT DOCUMENTS

| | | | | |
|---|---|---|---|---|
| 5,092,680 A * | 3/1992 | Kobayashi | ............ | G01J 5/0003 250/227.11 |
| 6,198,299 B1 | 3/2001 | Hollman | | |
| 6,476,906 B1 * | 11/2002 | Kim | ............ | G01L 1/24 250/559.01 |
| 6,621,275 B2 * | 9/2003 | Cotton | ............ | G01R 31/311 324/537 |
| 2003/0085351 A1 * | 5/2003 | Nakajima | ............ | B82Y 20/00 250/306 |
| 2006/0103378 A1 * | 5/2006 | Pakdaman | ............ | G01R 31/311 324/228 |
| 2007/0045539 A1 * | 3/2007 | Fukaya | ............ | H01J 37/28 250/310 |
| 2013/0293883 A1 * | 11/2013 | Yu | ............ | G01N 21/658 356/301 |
| 2015/0295242 A1 * | 10/2015 | Ducros | ............ | C01G 23/005 252/182.1 |

(Continued)

*Primary Examiner* — Patrick Assouad
*Assistant Examiner* — Demetrius Pretlow
(74) *Attorney, Agent, or Firm* — Lorenz & Kopf, LLP

(57) ABSTRACT

A system for detection of a photon emission generate by a device of an integrated circuit, and methods for detecting the same are provided. The system includes a device space configured to include the device. The system further includes an electrical probe proximate the device space and configured to couple to the device. The electrical probe is configured to induce the device to generate the photon emission. The system further includes an optical fiber having a first end proximate the device space and a second end spaced from the first end. The first end is configured to receive the photon emission generated by the device. The optical fiber is configured to transmit the photon emission from the first end to the second end. The system further includes a detector in communication with the second end of the optical fiber and configured to detect the photon emission transmitted by the optical fiber.

19 Claims, 3 Drawing Sheets

(56) References Cited

U.S. PATENT DOCUMENTS

2015/0377605 A1* 12/2015 Bridges .................... G06T 7/73
                                                       382/106
2016/0377675 A1* 12/2016 Ukraintsev .......... G01R 31/311
                                                     324/754.23

* cited by examiner

SYSTEM FOR DETECTION OF A PHOTON EMISSION GENERATED BY A DEVICE AND METHODS FOR DETECTING THE SAME

TECHNICAL FIELD

The technical field generally relates to a system for detection of a photon emission generated by a device, and methods for detecting the same.

BACKGROUND

The semiconductor industry is continuously moving toward the fabrication of smaller and more complex microelectronic devices with higher performance. The production of smaller integrated circuits requires the development of smaller electronic devices, and closer spacing of those electronic devices within the integrated circuits. After fabrication, many of these integrated circuits undergo a quality analysis to detect failed devices within the integrated circuit. A common indicator for a failed device is a photon emission by the device. Emission microscopy techniques, such as optical microscopy, have been used to detect the photon emission by these failed devices down to a resolution of 2 µm. More recently, other techniques have been developed to detect the photon emission, such as imaging systems utilizing a solid immersion lens with a resolution of 730 nm, or imaging systems utilizing a Fresnel lens with a resolution of 360 nm.

However, devices are now fabricated at sizes well beyond the resolution of the emission microscopy techniques described above. Further, photon emissions by these devices are decreased due to lower working voltages of the devices. Even if a photon emission is detected, determining the specific device attributed to the emission becomes challenging due to resolution limitations. As a result, the ability to detect failed devices is hindered, which in turn may negatively impact quality and operation of the device.

Accordingly, it is desirable to provide a system for detection of a photon emission generated by a device, and methods for detecting the same. Moreover, other desirable features and characteristics of the present embodiment will become apparent from the subsequent detailed description and the appended claims, taken in conjunction with the accompanying drawings and this background of the invention.

BRIEF SUMMARY

A system for detection of a photon emission generated by a device of an integrated circuit, and methods for detecting the same are provided herein. The system includes a device space configured to include the device when the device is present. The system further includes an electrical probe proximate the device space and configured to couple to the device when the device is present. The electrical probe is configured to induce the device to generate the photon emission when the device is present. The system further includes an optical fiber having a first end proximate the device space and a second end spaced from the first end. The first end is configured to receive the photon emission generated by the device when the device is present. The optical fiber is configured to transmit the photon emission from the first end to the second end. The system also includes a detector in communication with the second end of the optical fiber and configured to detect the photon emission transmitted by the optical fiber.

The method includes coupling an electrical probe to a device. An optical fiber is disposed proximate the device. An electrical signal is transmitted through the electrical probe to the device to induce the device to generate the photon emission in response to the electrical signal. The photon emission is detected by a detector through the optical fiber.

BRIEF DESCRIPTION OF THE DRAWINGS

The present embodiments will hereinafter be described in conjunction with the following drawing figures, wherein like numerals denote like elements, and wherein.

DETAILED DESCRIPTION

Figure 1:
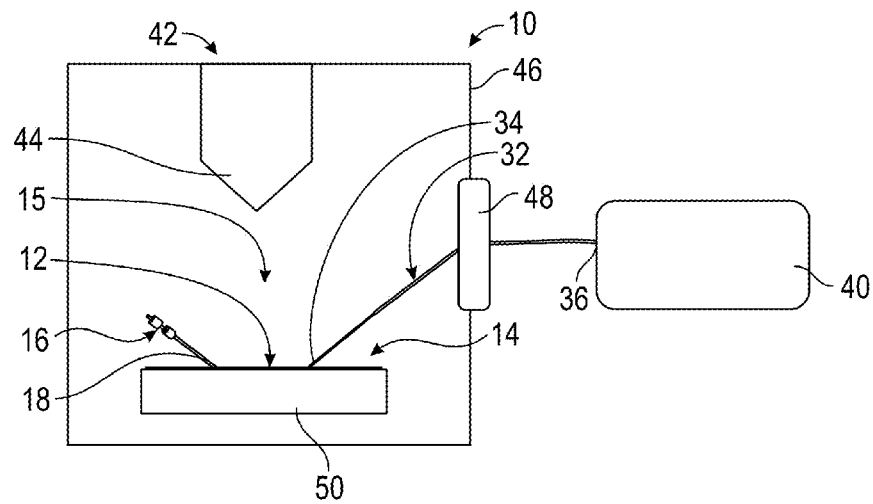
FIG. 1 is a schematic illustrating a non-limiting embodiment of a system for detection of a photon emission generated by a device of an integrated circuit.

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

A system for detection of a photon emission generated by a device of an integrated circuit is provided herein. In an exemplary embodiment, the system includes an electrical probe configured to couple to the device with the electrical probe further configured to induce the device to generate a photon emission. In this exemplary embodiment, the system further includes an optical fiber configured to be proximate the device with the optical fiber further configured to receive the photon emission generated by the device. In this exemplary embodiment, the system also includes an imaging component, such as SEM, TEM, or AFM, that has a resolution in the nanometer range. The resolution of the imaging component can determine the spatial resolution of the whole system. In this exemplary embodiment, the imaging component is configured to locate the device on the integrated circuit. Further, in this exemplary embodiment, the imaging component is configured to facilitate positioning of the electrical probe proximate the device and to facilitate coupling of the electrical probe to the device. Moreover, in this exemplary embodiment, the imaging component is configured to facilitate positioning of the optical fiber proximate the device and/or the photon emission for receiving the photo emission.

A greater understanding of the system described above and of the method for detecting the photon emission generated by the device may be obtained through a review of the illustrations accompanying this application together with a review of the detailed description that follows.

A system 10 for detection of a photon emission generated by a device 12 of an integrated circuit 14 will now be described with reference to FIGS. 1-3. The integrated circuit 14 includes a semiconductor material. The semiconductor material may be any semiconductor material that is known for industrial use in electronic devices including monocrystalline silicon materials, polycrystalline silicon materials, and silicon admixed with other elements such as germanium, carbon, and the like. Examples of the semiconductor material include, but are not limited to, those chosen from silicon, silicon germanium (SiGe), germanium (Ge), gallium arsenide (GaAs), or indium phosphide (InP). An exemplary semiconductor material is a silicon substrate. The silicon substrate may be a bulk silicon wafer or may be a thin layer of silicon on insulating layer (commonly known as silicon-on-insulator or SOI) that, in turn, is supported by a carrier wafer. The device 12 may be a transistor, a memory device, a resistor, a capacitor, or the like. The device 12 may have a size of no greater than 300, alternatively no greater than 100, or alternatively no greater than 50, nanometers (nm). However, it is to be appreciated that the device 12 may have any size known in the art for integrated circuits. In certain embodiments, the size of the device 12 may be referred to as the critical dimension of the device 12. In embodiments, the photon emission has a spectral range of from ultraviolet to far infrared. In certain embodiments, the photon emission has a spectral range of from visible to far infrared. In one exemplary embodiment, the photon emission has an infrared spectral range. However, it is to be appreciated that the photon emission may have any spectral range. For example, when the device 12 is a transistor including a failed gate oxide, the photon emission emitted from the device 12 has a spectral range of from 700 nm to 900 nm.

Figure 2:
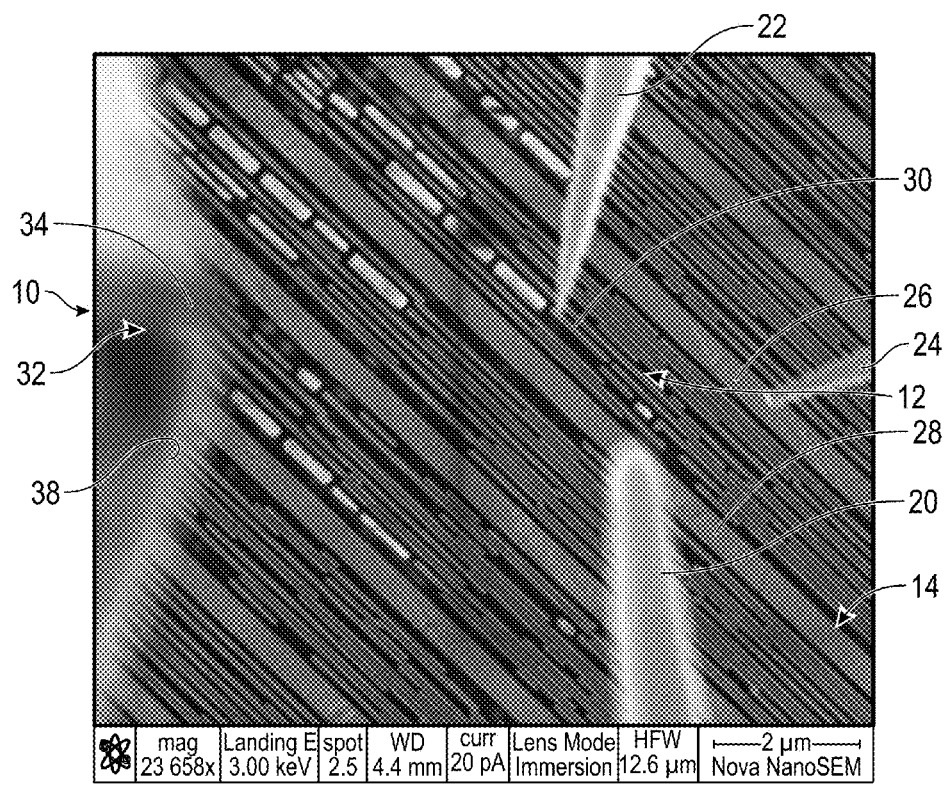
FIG. 2 is an image from a scanning electron microscope of a non-limiting embodiment of the system and the device of FIG. 1.

Referring to FIGS. 1 and 2, the system 10 is configured for use with the device 12 when the device 12 is present. More specifically, each component of the system 12 described below is configured for use with the device 12 when the device 12 is present. To this end, the system 10 may be manufactured, transported, and/or stored without the device 12 present. The system 10 includes a device space 15 configured to include the device 12. The system 12 further includes an electrical probe 16 proximate the device space 15. The electrical probe 16 is configured to couple to the device 12. The term "couple" as utilized herein with regard to the electrical probe 16 means that the electrical probe 16 is directly or indirectly in contact with the device 12. In certain embodiments, the electrical probe 16 is configured to directly couple to the device 12. The electrical probe 16 is configured to induce the device 12 to generate the photon emission. In embodiments, the electrical probe 16 is further configured to transmit an electrical signal to the device 12 to induce the device 12 to generate the photon emission in response to the electrical signal. The electrical probe 16 may include a tip 18 proximate the device space 15 and configured to couple to the device 12 with the tip 18 having a diameter of no greater than 100, alternatively no greater than 50, alternatively no greater than 25, nm. In one exemplary embodiment, the tip 18 has a diameter of 40 nm. In another exemplary embodiment, the tip has a diameter of 20 nm. It is to be appreciated that as the diameter of the tip 18 decreases, the resolution of the electrical probe 16 increases. In embodiments, the system 10 includes three electrical probes 16, such as a first electrical probe 20, a second electrical probe 22, and a third electrical probe 24. However, it is to be appreciated that the system 10 can include any number of electrical probes 16 for inducing the device 12 to generate the photon emission in response to the electrical signal. In one embodiment, the device 12 is a transistor including a source region 26, a drain region 28, and a gate 30. In these embodiments, the first electrical probe 20 may be coupled to the drain region 28, the second electrical probe 22 may be coupled to the gate 30, and the third electrical probe 24 may be coupled to the source region 26.

The system 10 further includes an optical fiber 32 having a first end 34 proximate the device space 15 and a second end 36 spaced from the first end 34. The first end 34 is configured to receive the photon emission generated by the device 12 and the optical fiber 32 is configured to transmit the photon emission from the first end 34 to the second end 36. However, it is to be appreciated that the system 10 can include any number of optical fibers 32 for receiving and transmitting the photon emission. The optical fiber 32 includes a core with a cladding overlying the core. The optical fiber 32 may further include a jacket overlying the cladding. In embodiments when the optical fiber 32 includes the jacket, the first end 34 of the optical fiber 32 may be free of the jacket such that the cladding is exposed. Without being bound by theory, in embodiments, the first end 34 is free of the jacket to minimize charging of the optical fiber 32 by components of the system 10. In embodiments, a portion of the core proximate the first end 34 has a diameter of no greater than 1000 micrometers (µm), alternatively no greater than 750 µm, alternatively no greater than 600 µM, alternatively from 1000 µm to 1 µm, alternatively from 850 µm to 350 µm, or alternatively from 750 µm to 450 µm. In one exemplary embodiment, the optical fiber 32 has a diameter of 600 µm. In embodiments, the core of the optical fiber 32 has a numerical aperture (NA) of from 0.1 to 0.5. In one exemplary embodiment, the core of the optical fiber 32 has a NA of 0.22. However, it is to be appreciated that the optical fiber 32 may have any NA known in the art for receiving and transmitting photon emissions. The optical fiber 32 may be single mode or multi-mode. In one exemplary embodiment, the optical fiber is multi-mode.

In embodiments, the optical fiber 32 has a length extending between the first end 34 and the second end 36 with the first end 34 of the optical fiber 32 including a surface 38. The surface 38 may be configured to be parallel to the device 12 such that the surface 38 is configured to receive the photon emission. Without being bound by theory, in embodiments, it is believed that configuring the surface 38 to be parallel to the device 12 results in maximizing receipt of the photon emission from the device 12. In certain embodiments, the surface 38 is at an angle of from 1 to 89, alternatively 10 to 80, alternatively 20 to 70, or alternatively 30 to 60, degree(s), each relative to the length of the optical fiber 32 such that the surface 38 and the device 12 are parallel to each other. For example, in embodiments, when the length of the optical fiber 32 is at an angle of 30 degrees relative to the device 12, the surface 38 is at an angle of 60 degrees relative to the length such that the surface 38 and the device 12 are parallel to each other. As another example, in embodiments, when the length of the optical fiber 32 is at an angle of 45 degrees relative to the device 12, the surface 38 is at an angle of 45 degrees relative to the length such that the surface 38 and the device 12 are parallel to each other. In embodiments, the surface 38 has an angle of from 1 to 89 to render the surface 38 and the device 12 parallel to each other while permitting the optical fiber 32 to receive the photon emission in view of space constraints within the system 10. The surface 38 may undergo polishing to form the surface 38 having an angle of from 1 to 89 degrees relative to the length.

In embodiments, the first end 34 of the optical fiber 32 includes a conductive material. The conductive material may be coated on the optical fiber 32, disposed within the optical fiber 32, or a combination thereof. In certain embodiments, the conductive material is coated on the optical fiber 32. In an exemplary embodiment, the conductive material includes platinum (Pt). However, it is to be appreciated that other conductive materials may be utilized, such as gold (Au). Without being bound by theory, it is believed that the conductive material of the optical fiber 32 may minimize charging of the optical fiber 32 by components of the system 10.

In an exemplary embodiment, the optical fiber 32 includes a conductive material and is polished to form the surface 38 having an angle of from 1 to 89 degrees relative to the length. First, the first end 34 of a first optical fiber is coated with the conductive material including platinum by first removing the jacket from the first end 34 to expose the cladding. Then, the exposed first end 34 is placed in a sputter coater with a platinum target, such as BAL-TEC SCD005. Next, a first half of the first end 34 is coated with platinum to a thickness of 15 nm utilizing the sputter coater at a current of 30 mA and for a time duration of 200 second. Then, the first end 34 is rotated 180 degrees to coat a second half of the first end 34 with platinum to a thickness of 15 nm. Next, the surface 38 of the coated first end 34 is polished and fused to a second optical fiber to form the optical fiber 32.

The system 10 further includes a detector 40 in communication with the second end 36 of the optical fiber 32. The detector 40 is configured to detect the photon emission transmitted by the optical fiber 32. In certain embodiments, the detector 40 is further defined as an optical spectrometer configured to detect photon emissions in a spectral range of from 600 nm to 1700 nm. An example of a suitable detector includes a spectrophotometer available from Horiba, under the trade name iHR320 with the DSS InGaAs detector. In one embodiment, the photon emission detected by the detector 40 is analyzed utilizing spectral analysis. In another embodiment, the photon emission detected by the detector 40 is analyzed utilizing time-resolved emission analysis to provide switching dynamic characterization for debug and analysis of the device 12. In embodiments, the detector 40 is configured to detect various characteristics and/or properties of the photon emission, such as photon counts, images, or a combination thereof. The detector 40 is further configured to generate a detector signal in response to detecting the photon emission. The detector signal may be generated prior to analysis of the photon emission, after analysis of the photon emission, or a combination thereof.

Figure 3:
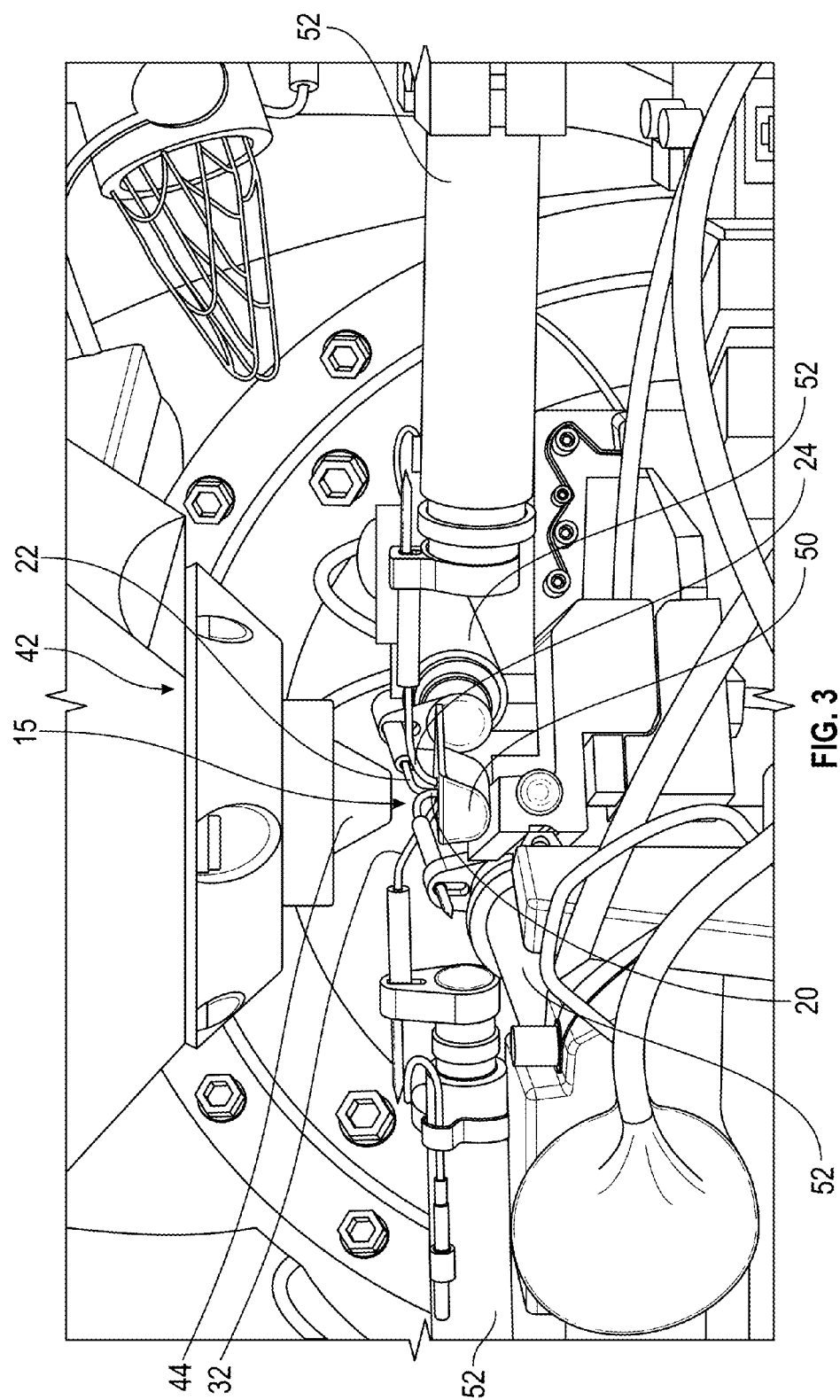
FIG. 3 is a perspective view illustrating a non-limiting embodiment of the system of FIG. 1.

Referring to FIGS. 1 and 3, the system 10 further includes an imaging component 42 configured to image the device 12. The imaging component 42 may have a lateral resolution of at least 300, alternatively at least 200, or alternatively at least 100, am. It is to be appreciated that a lower resolution size results in an increased resolution of the component (e.g., a 100 nm resolution is higher than a 200 am resolution) such that a lateral resolution of at least 100 nm includes 99 nm, 80 nm, 10 nm, etc. In one exemplary embodiment, the imaging component 42 has a lateral resolution of 50 nm. The imaging component 42 is further configured to generate an image signal in response to imaging the device 12.

In certain embodiments, the imaging component 42 includes a scanning electron microscope (SEM). However, it is to be appreciated that the imaging component 42 may include other non-limiting microscopes, such as an atomic force microscope (AFM), a transmission electron microscope (TEM), or an optical microscope (OM), so long as the microscope has a lateral resolution of at least 300 nm. The SEM may include an electron beam column 44 proximate the device space 15 and positioned transverse to the device 12. In embodiments, the electron beam column 44 is configured to be spaced from the device 12 in an amount of no greater than 100, alternatively no greater than 50, or alternatively no greater than 5, mm. While conventional detection techniques (e.g., optical microscopy) cannot be utilized to detect generation of the photon emission by the device 12 due to the space constraints between the device 12 and the electron beam column 44, the optical fiber 32 can be positioned proximate the device 12 and utilized to receive and transmit the photon emission to the detector 40. In embodiments, the electron beam column 44 is configured to scan a focused electron beam over the device 12 to image the device 12. During scanning of the focused electron beam, the optical fiber 32 can become charged. As introduced above, exposure of the cladding of the optical fiber 32 and inclusion of the conductive material can minimize charging of the optical fiber 32.

Referring back to FIG. 1, in embodiments, the system 10 further includes a chamber 46 configured to contain at least the device 12, the electrical probe 16, the imaging component 42, and the optical fiber 32. The chamber 46 may be under a vacuum during operation of the system 10. The chamber 46 may include a feedthrough 48 with the optical fiber 32 extending through the feedthrough 48 for communicating with the detector 40. In embodiments, the feedthrough 48 may include an O-ring flange configured to receive the optical fiber 32 while maintaining a vacuum in the chamber 46.

Referring to FIGS. 1 and 3, in embodiments, the system 10 further includes a stage 50 configured to support the device 12. The stage 50 may move laterally and/or vertically relative to the imaging component 42 to align the device 12 with the imaging component 42. The system 10 further includes a manipulator 52 coupled to each of the electrical probe 16 and the optical fiber 32. The manipulator 52 is configured to position the electrical probe 16 and the optical fiber 32 proximate the device 12. It is to be appreciated that the system 10 may include more than one manipulator such that each electrical probe 16 and each optical fiber can be positioned independent of each other. In certain embodiments, the manipulator 52 has a resolution of at least 1 µm, alternatively at least 100 nm, alternatively at least 50 nm, or alternatively at least 5 nm. It is to be appreciated that a lower resolution size results in an increased resolution of the component (e.g., a 50 nm resolution is higher than a 100 nm resolution). Therefore, a resolution of at least 100 nm includes 99 nm, 80 nm, 10 nm, etc.

In embodiments, the system 10 further includes a computer in communication with various components of the system 10. The computer may include a processor for computing tasks and a display for displaying signals. The computer may be in communication with the electrical probe 16 to transmit the electrical signal to the device 12. The computer may be in communication with the manipulator to position the electrical probe 16 and the optical fiber 32 proximate the device 12. The computer may be in communication with the imaging component 42 to analyze and/or display the image signal generated by the imaging component 42. The computer may be in communication with the detector 40 to analyze and/or display the detector signal generated by the detector 40. The computer may be in communication with the stage 50 to position the stage 50 relative to the electrical probe 16 to align the device 12 with the electrical probe 16.

Figure 4:
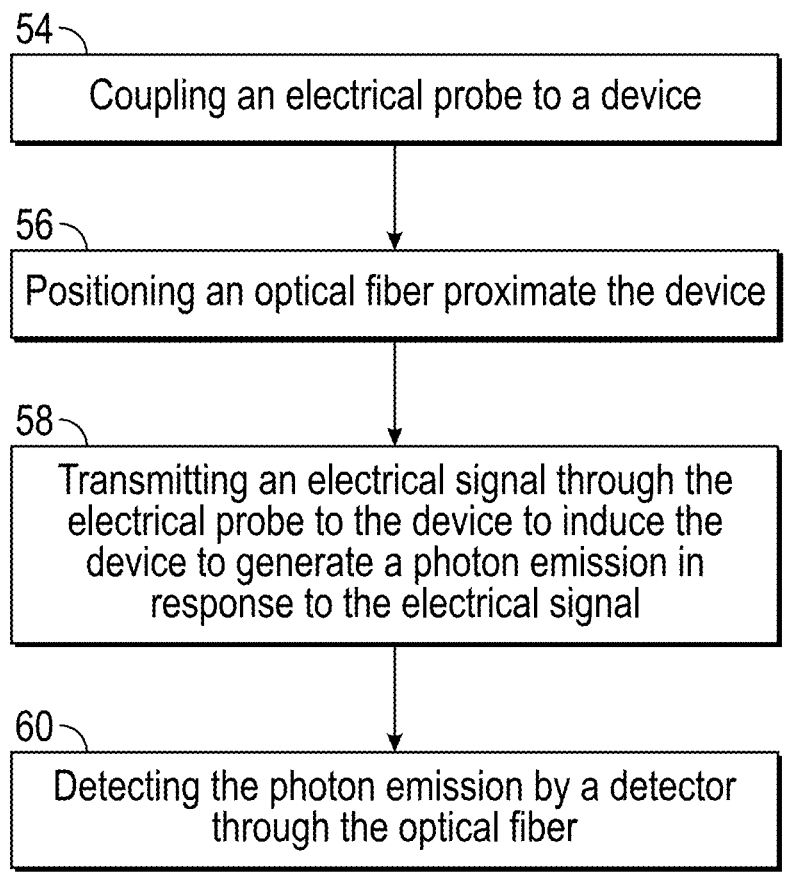
FIG. 4 is a flow chart illustrating a non-limiting embodiment of a method for detecting the photon emission generated by the device utilizing the system of FIG. 1.

A method for detecting the photon emission generated by the device 12 will now be described with reference to FIG. 4 and continuing reference to FIGS. 1-3. In embodiments, the method includes the step of disposing the device 12 on the stage 50. In embodiments, the method further includes the step of sealing the chamber 46 and purging air from the chamber 46 to form a vacuum in the chamber 46, in embodiments, the method further includes the step of imaging the device 12 by the imaging component 42 to generate an image signal in response to imaging the device 12. The step of imaging the device 12 may include the step of disposing the electron beam column 44 adjacent the device 12 such that the electron beam column 44 is spaced from the device 12 in an amount of no greater than 100 mm. In embodiments, the method also includes the step of positioning the stage 50 relative to the electrical probe 16 to align the device 12 with the electrical probe 16. Positioning of the stage 50 typically provides a "rough" alignment of the device 12 with the electrical probe 16. Positioning of the stage 50 and thus positioning of the device 12 may be facilitated utilizing the image signal generated by the imaging component 42.

The method further includes the step 54 of coupling the electrical probe 16 to the device 12. The step 54 of coupling the electrical probe 16 to the device 12 may include the step of positioning the electrical probe 16 proximate the device 12 to align the electrical probe 16 with the device 12. Positioning of the electrical probe 16 typically provides a "precise" alignment of the electrical probe 16 with the device 12. Positioning of the electrical probe 16 may be facilitated utilizing the image signal generated by the imaging component 42. The step 54 of coupling the electrical probe 16 to the device 12 may further include the step of disposing the electrical probe 16 on the device 12. The electrical probe 16 may be disposed on any portion of the device 12 to induce the device 12 to generate the photon emission, such as the source region 26, the drain region 28, the gate 30, etc. In embodiments when the device 12 is a transistor and the system 10 includes three electrical probes 16, the first electrical probe 20 may be coupled to the drain region 28, the second electrical probe 22 may be coupled to the gate 30, and the third electrical probe 24 may be coupled to the source region 26.

The method also includes the step 56 of positioning the optical fiber 32 proximate the device 12. The method may further include the step of positioning the surface 38 of the optical fiber 32 parallel to the device 12. As described above, it is believed that configuring the surface 38 to be parallel to the device 12 results in maximizing receipt of the photon emission from the device 12. Positioning of the optical fiber 32 may be facilitated utilizing the image signal generated by the imaging component 42.

The method further includes the step 58 of transmitting the electrical signal through the electrical probe 16 to the device 12 to induce the device 12 to generate the photon emission in response to the electrical signal. The method also includes the step 60 of detecting the photon emission by the detector 40 through the optical fiber 32. In embodiments, the method further includes generating the detector signal in response to detecting the photon emission. In embodiments, the method further includes displaying the detector signal on the computer.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A system for detection of a photon emission generated by a device of an integrated circuit, said device comprising a drain region, a gate, and source region, said system comprising:
   a device space configured to comprise the device when the device is present;
   a first electrical probe proximate said device space, and configured to couple to the drain region and to induce the device to generate the photon emission when the device is present;
   a second electrical probe proximate said device space, and configured to couple to the gate and to induce the device to generate the photon emission when the device is present;
   a third electrical probe proximate said device space, and configured to be coupled to the source region and to induce the device to generate the photon emission when the device is present;
   an optical fiber having a first end proximate said device space and a second end spaced from said first end with said first end configured to receive the photon emission generated by the device when the device is present and said optical fiber configured to transmit the photon emission from said first end to said second end; and
   a detector in communication with said second end of said optical fiber and configured to detect the photon emission transmitted by said optical fiber.

2. The system of claim 1 further comprising an imaging component configured to image the device, and to generate an image signal in response to imaging the device.

3. The system of claim 2, wherein said imaging component has a lateral resolution of at least 300 nanometers.

4. The system of claim 2, wherein said imaging component comprises a scanning electron microscope.

5. The system of claim 4, wherein said scanning electron microscope comprises an electron beam column, and said electron beam column is configured to be spaced from the device in an amount of no greater than 100 millimeters.

6. The system of claim 1, wherein said electrical probe is further configured to transmit an electrical signal to said device to induce said device to generate said photon emission in response to said electrical signal.

7. The system of claim 1, wherein said electrical probe comprises a tip proximate said device space and configured to couple to the device with said tip having a diameter of no greater than 100 nanometers.

8. The system of claim 1, wherein said electrical probe is configured to directly couple to the device.

9. The system of claim 1, wherein said optical fiber has a length extending between said first end and second end with said first end of said optical fiber comprising a surface at an angle of from 1 to 89 degree(s) relative to said length of said optical fiber such that said surface is configured to be parallel to the device.

10. The system of claim 1, wherein said first end of said optical fiber comprises a conductive material.

11. The system of claim 10, wherein said conductive material comprises platinum.

12. The system of claim 1 further comprising a chamber configured to contain at least the device, said electrical probe, said imaging component, and said optical fiber.

13. The system of claim 12, wherein said chamber comprises a feedthrough with said optical fiber extending through said feedthrough for communicating with said detector.

14. A method for detecting a photon emission generated by a device of an integrated circuit, said device comprising a drain region, a gate, and source region, said method comprising:
   coupling a first electrical probe to the drain region;
   coupling a second electrical probe to the gate;
   coupling a third electrical probe to the source region;
   positioning an optical fiber proximate the device;
   transmitting an electrical signal through at least one of the first electrical probe, the second electrical probe, and the third electrical probe, to the device to induce the device to generate the photon emission in response to the electrical signal; and
   detecting the photon emission by a detector through the optical fiber.

15. The method of claim 14 further comprising the steps of imaging the device by an imaging component to generate an image signal in response to imaging the device.

16. The method of claim 15, wherein the imaging component comprises an electron beam column, and said method further comprises the step of disposing the electron beam column adjacent the device such that the electron beam column is spaced from the device in an amount of no greater than 100 millimeters.

17. The method of claim 14 further comprising the steps of:
   disposing the device on a stage; and
   positioning the stage relative to the electrical probe to align the device with the electrical probe.

18. The method of claim 14, wherein the step of coupling the electrical probe to the device includes the steps of:
   positioning the electrical probe proximate the device to align the electrical probe with the device; and
   disposing the electrical probe on the device.

19. The method of claim 14, wherein the optical fiber comprises a surface proximate the device, and said method further comprising the step of positioning the surface parallel to the device.

* * * * *